(12) United States Patent
Zhang et al.

(10) Patent No.: US 9,947,693 B2
(45) Date of Patent: Apr. 17, 2018

(54) ARRAY SUBSTRATE, METHOD FOR MANUFACTURING THE SAME, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Pengju Zhang, Beijing (CN); Xin Li, Beijing (CN); Hong Zhu, Beijing (CN); Detao Zhao, Beijing (CN); Xuchen Yuan, Beijing (CN)

(73) Assignees: BOE TECHNOLOGY GROUP CO., LTD. (CN); BEIJING BOE OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 15/274,327

(22) Filed: Sep. 23, 2016

(65) Prior Publication Data
US 2017/0110480 A1 Apr. 20, 2017

(30) Foreign Application Priority Data
Oct. 15, 2015 (CN) .......................... 2015 1 0671824

(51) Int. Cl.
*H01L 27/14* (2006.01)
*H01L 27/12* (2006.01)
(52) U.S. Cl.
CPC ........ *H01L 27/124* (2013.01); *H01L 27/1262* (2013.01)

(58) Field of Classification Search
CPC ............... H01L 27/1262; H01L 27/124; H01L 29/78606; H01L 29/66765;
(Continued)

(56) References Cited

U.S. PATENT DOCUMENTS

2007/0109457 A1* 5/2007 Song ................... H01L 51/0541
349/44
2007/0170455 A1 7/2007 Choi et al.
(Continued)

FOREIGN PATENT DOCUMENTS

CN 101009310 A 8/2007
CN 102280452 A 12/2011

OTHER PUBLICATIONS

First Office Action for Chinese Application No. 201510671824.6, dated Sep. 26, 2017, 7 Pages.

*Primary Examiner* — Trung Q Dang
(74) *Attorney, Agent, or Firm* — Brooks Kushman P.C.

(57) ABSTRACT

The present disclosure provides an array substrate, a method for manufacturing the same, and a display device relating to the technical field of the array substrate. The array substrate includes a base, a plurality of leads and a plurality of inclined supporting surfaces, wherein the inclined supporting surfaces are strip-like and are inclined relative to the base, and a length direction of each of the inclined supporting surfaces is parallel to the base; and at least a part of the leads are inclined leads, and at least a part of each of the inclined leads is arranged on the corresponding inclined supporting surface and extends in the length direction of the inclined supporting surface.

15 Claims, 2 Drawing Sheets

(58) Field of Classification Search
CPC ......... H01L 29/78603; H01L 29/78696; H01L 29/41733; H01L 29/42384; H01L 29/66742; H01L 29/4175
See application file for complete search history.

(56) References Cited

U.S. PATENT DOCUMENTS

2011/0303917 A1* 12/2011 Lee .................... H01L 27/12
  257/59
2014/0339548 A1* 11/2014 Yamazaki .......... H01L 29/7869
  257/43
2015/0340512 A1* 11/2015 Li ...................... H01L 27/1218
  257/72

* cited by examiner

ARRAY SUBSTRATE, METHOD FOR MANUFACTURING THE SAME, AND DISPLAY DEVICE

CROSS-REFERENCE TO RELATED APPLICATIONS

This application claims priority to Chinese application No. 201510671824.6, filed Oct. 15, 2015, which is hereby incorporated by reference in its entirety.

TECHNICAL FIELD

The present disclosure relates to the technical field of the array substrate, in particular to an array substrate, a method for manufacturing the same and a display device.

BACKGROUND

Along with improvements on high resolution ratios and opening ratios of display devices such as the liquid crystal display device, the organic light-emitting diodes (OLED) display device and the like, their array substrates have larger and larger structure densities, and correspondingly, each of all structures occupies smaller and smaller areas.

Regarding the leads such as a gate line in the array substrate, a reduction of the area of the lead is mainly characterized by a reduction in width. As a result, the lead resistance rises, and the lead may be easily fractured so as to reduce the property of the array substrate.

SUMMARY

An object of the present disclosure is to provide an array substrate whose leads have low resistance and whose wires are not easily disconnected, a method of manufacturing the same, and a display device so as to solve the problem related to the array substrate whose leads have high resistance and which are easily disconnected in related arts.

For solving the above technical problem, the present disclosure provides an array substrate, which includes a base, a plurality of leads and a plurality of inclined supporting surfaces, wherein the inclined supporting surfaces are strip-like and are inclined relative to the base, and a length direction of each of the inclined supporting surfaces is parallel to the base; and at least a part of the leads are inclined leads, and at least a part of a length of each of the inclined leads is arranged on the corresponding inclined supporting surface and extends in the length direction of the inclined supporting surface.

Optionally, an included angle formed between the inclined supporting surface and the base ranges from 45 degrees to 70 degrees.

Optionally, the inclined leads include a gate line, a data line or a common electrode line.

Optionally, the inclined leads include the gate lines, wherein active regions of at least a part of thin film transistors (TFTs) are arranged on the gate lines arranged on the inclined supporting surfaces, and a gate insulation layer is arranged between the active regions and the gate lines.

Optionally, the array substrate further includes a plurality of strip-like protuberances that are arranged on the base and made of insulation materials, wherein at least one lateral surface of each of the protuberances is inclined relative to the base, and the lateral surface is the inclined supporting surface.

Optionally, two lateral surfaces of each of the protuberances are inclined relative to the base, and the two lateral surfaces are the inclined supporting surfaces.

Optionally, the array substrate further includes an auxiliary insulation layer, wherein a plurality of grooves is disposed in the auxiliary insulation layer, at least one lateral surface of each of the grooves is inclined relative to the base, and the lateral surface is the inclined supporting surface.

Optionally, the auxiliary insulation layer is a gate insulation layer, and the inclined lead arranged on the at least one lateral surface of the each of the grooves in the gate insulation layer are data lines.

The present disclosure further provides a method of manufacturing an array substrate, which includes steps of: forming inclined supporting surfaces on a base, wherein the inclined supporting surfaces are strip-like and are inclined relative to the base, and the length direction of each of the inclined supporting surfaces is parallel to the base; and forming inclined leads, wherein at least a part of each of the inclined leads is arranged on the inclined supporting surface and extends in the length direction of the inclined supporting surface.

Optionally, the inclined lead includes gate lines, wherein the step of forming the inclined leads includes steps of: forming gate lines by a patterning process, wherein at least a part of each of the gate lines is arranged on the corresponding inclined supporting surface and extends in the length direction of the inclined supporting surface; after the step of forming the inclined leads is carried out, the method further includes steps of: forming a gate insulation layer that covers the gate lines, and forming active regions by a patterning process, wherein the active regions are arranged on the gate lines on the inclined supporting surfaces.

Optionally, the step of forming the gate insulation layer that covers the gate lines includes steps of: forming the gate insulation layer that covers the gate lines by a patterning process, wherein a plurality of grooves is disposed in the auxiliary insulation layer, and at least one lateral surface of each of the grooves is the inclined supporting surface; after the step of forming the active region by the patterning process, the method further includes a step of: forming source electrodes, drain electrodes and data lines by a patterning process, wherein the source electrodes and the drain electrodes contact the active regions, the data lines are connected to the source electrodes; and at least a part of each of the data lines is arranged on the lateral surface of the groove and extends in the length direction of the lateral surface of the groove in the insulation layer.

The present disclosure further provides a display device, which includes an array substrate, wherein the array substrate includes a base and a plurality of leads.

Optionally, the display device further includes a plurality of strip-like protuberances that are arranged on the base and are made of insulation materials, wherein each of the protuberances has at least one lateral surface that is inclined relative to the base; the inclined supporting surfaces are strip-like, and the length direction of the inclined supporting surfaces is parallel to the base; and at least a part of the leads are inclined leads, and at least a part of each of the inclined leads is arranged on the inclined supporting surface and extends in the length direction of the inclined supporting surface.

Optionally, an included angle formed between the base and the inclined supporting surface ranges from 45 degrees to 70 degrees.

Optionally, the inclined leads include a gate line, a data line or a common electrode line.

Optionally, the inclined leads include the gate lines, wherein active regions of at least a part of thin film transistors (TFTs) are arranged on the gate lines arranged on the inclined supporting surfaces, and a gate insulation layer is arranged between the active regions and the gate lines.

Optionally, two lateral surfaces of each of the protuberances are inclined relative to the base, and the two lateral surfaces are the inclined supporting surfaces.

Optionally, the display device further includes an auxiliary insulation layer, wherein a plurality of grooves is disposed in the auxiliary insulation layer, at least one lateral surface of each of the grooves is inclined relative to the base, and the lateral surface is the inclined supporting surface; the inclined supporting surfaces are strip-like, and a length direction of each of the inclined supporting surfaces is parallel to the base; at least a part of the leads are inclined leads, and at least a part of each of the inclined leads is arranged on the corresponding inclined supporting surface and extends in the length direction of the inclined supporting surface.

Optionally, the auxiliary insulation layer is a gate insulation layer, and the inclined leads arranged on the inclined supporting surfaces are data lines.

Optionally, a thickness of each of the grooves that extends in a direction perpendicular to the base is smaller than a thickness of the auxiliary insulation layer.

The array substrate of the present disclosure includes the inclined supporting surface and the inclined leads. In other words, at least a part of the leads are arranged on the inclined surfaces, and thus, an actual width of each of the leads is larger than a width of its orthographic projection on the base. Therefore, the actual width of the lead is increased without increasing the area of the lead, thereby to reduce both the resistance and the breakage rate of the lead.

REFERENCE SIGN LIST

1 inclined supporting surface;
11 protuberance;
12 auxiliary insulation layer;
2 gate line;
3 gate insulation layer;
4 active region;
5 data line;
9 base.

DETAILED DESCRIPTION

As required, detailed embodiments are disclosed herein. However, it is to be understood that the disclosed embodiments are merely exemplary and that various and alternative forms may be employed. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

The present disclosure will be described hereinafter in a clear and complete manner in conjunction with the drawings and embodiments so that a person skilled in the art can better understand the technical solution of the present disclosure.

As shown in FIGS. 1 to 5, in some embodiments, the present disclosure provides an array substrate, which includes a base 9, a plurality of leads and a plurality of inclined supporting surfaces 1, wherein the inclined supporting surfaces 1 are strip-like and are inclined relative to the base 9, and a length direction of each of the inclined supporting surfaces is parallel to the base 9; and at least a part of the leads are inclined leads, and at least a part of a length of each of the inclined leads is arranged on the corresponding inclined supporting surface 1 and extends in the length direction of the inclined supporting surface 1.

That is, compared with the array substrate in the related art, the array substrate in some embodiments of the present disclosure has a similar structure, and specifically, it includes the base 9 configured to support other structures, and has structures in the related art such as a Thin Film Transistor (TFT) arranged, leads such as a gate line 2, a data line 5 and a common electrode line, electrodes and Organic Light-emitting Diode (OLED) on the base 9.

Figure 1:
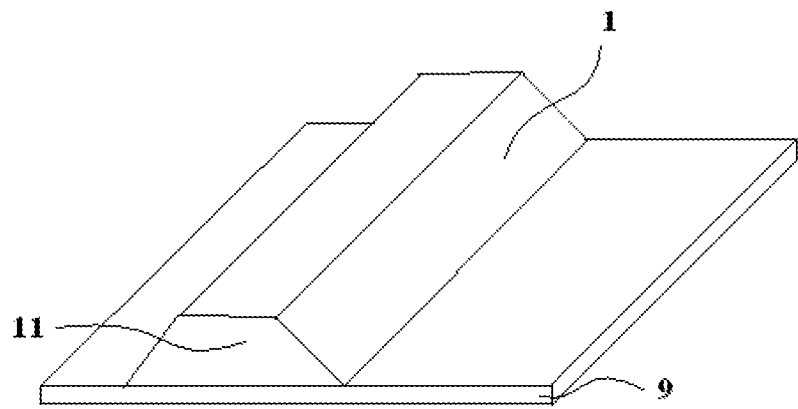
FIG. 1 is a schematic view showing an inclined supporting surface of an array substrate in some embodiments of the present disclosure.
Figure 2:
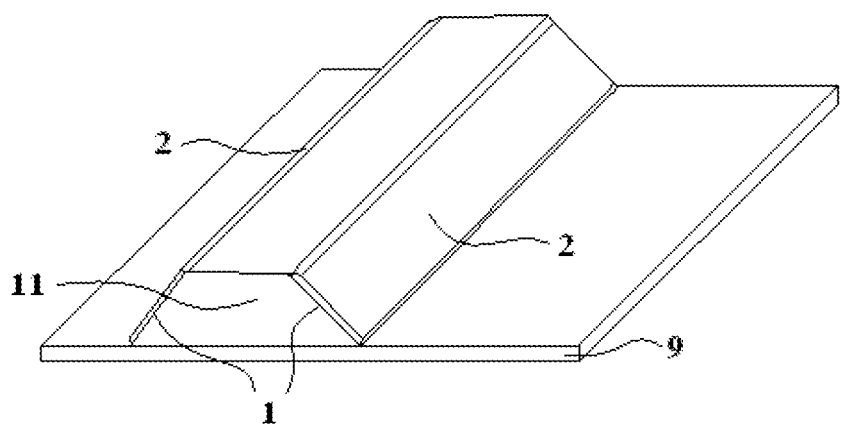
FIG. 2 is a schematic view showing an inclined supporting surface arranged thereon with a gate line in some embodiments of the present disclosure.

However, the array substrate in embodiments of the present disclosure differs from the array substrate in the related art in that array substrate in embodiments of the present disclosure further includes an inclined supporting surface 1 and at least a part of the leads are inclined leads. As shown in FIGS. 1 and 2, the inclined supporting surface 1 is strip-like and a length direction thereof is parallel to the base 9 and is inclined relative to the base 9. That is, in a cross section perpendicular to the length direction of the inclined supporting surface 1, an angle formed between a line imaginarily cut from an edge of the inclined supporting surface 1 and a line imaginarily cut from the edge of the base 9 is larger than 0 degree and smaller than 90 degrees. At least a part of each of the inclined leads is arranged on the inclined supporting surface 1. That is, the inclined leads extend in the length direction of the inclined supporting surface 1, and are arranged on the inclined supporting surface 1. In brief, in some embodiments of the present disclosure, at least a part of the leads in the array substrate are arranged on the inclined surface.

Figure 3:
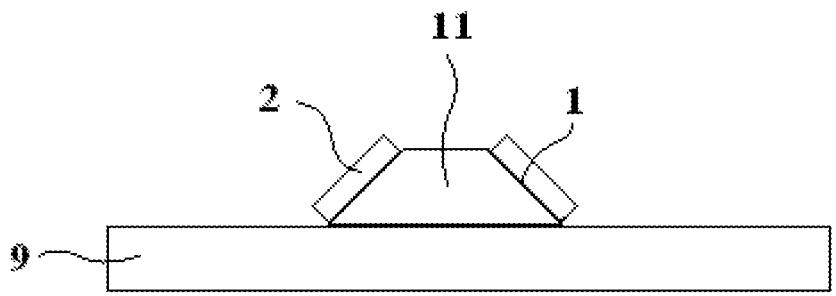
FIG. 3 is a sectional view of the array substrate shown in FIG. 2.

Obviously, as shown in FIGS. 2 and 3, the actual width of the inclined surface is definitely greater than a width of an orthographic projection of the inclined surface on the base 9. Therefore, the actual width of each of the inclined leads arranged on the inclined supporting surfaces 1 definitely is greater than the width of its orthographic projection on the base 9. Therefore, the actual width of each of the lead is increased without increasing the area of the lead (i.e. the width of its orthographic projection on the base 9), thereby to reduce both the resistance and the breakage rate of the leads.

Optionally, an included angle formed between the inclined supporting surface 1 and the base 9 ranges from 45 degrees to 70 degrees.

Obviously, if the included angle formed between the base 9 and the inclined supporting surface 1 is too small, the effect of increasing the width of the lead is not obvious, and if the included angle is too large, the manufacture of the leads may be more difficult. It is found in the relevant studies that the above angle range is suitable.

Optionally, each of the inclined leads include at least one of a gate line 2, a data line 5 and a common electrode line.

In other words, the gate line 2, the data line 5 and the common electrode line all can be arranged on the inclined supporting surface 1 so as to function as the inclined lead. Of course, if the array substrate further includes other leads such as the lead used for touch, it also can be the inclined lead.

Optionally, the inclined leads include the gate line 2, wherein at least a part of active regions 4 of thin film transistors (TFTs) are arranged on the gate lines 2 arranged on the inclined supporting surfaces 1, and a gate insulation layer 3 is arranged between the active regions 4 and the gate lines 3.

Figure 4:
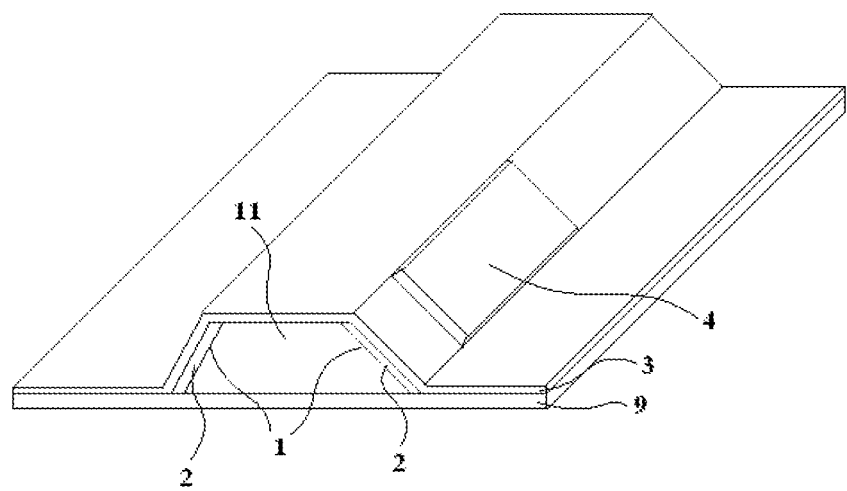
FIG. 4 is a schematic view showing an inclined supporting surface arranged thereon with a gate line and an active region in some embodiments of the present disclosure.

That is, as shown in FIG. 4, when the gate line 2 is arranged on the inclined support surface 1, the active region 4 of the TFT can be directly arranged on the gate line 2 on the inclined supporting surface 1 (the gate insulation layer 3 is definitely between the gate line 2 and the active region 4). In other words, there is no gate electrode stretched out from the gate line 2, instead a part of the gate line 2 that overlaps with the active region 4 also serves as a gate electrode.

According to the array substrate hereinabove, the area of the active region 4 is increased without increasing the area of the orthographic projection of the active region 4, thereby to improve the conductivity ability of the TFT. Meanwhile, since the active region 4 is arranged on the opaque gate line 2, the area of the opaque structure is not enlarged, thereby increasing the aperture ratio of the array substrate.

At this time, at least parts of the source electrode and the drain electrode (not shown in the figures) are definitely arranged on the inclined supporting surface 1 so as to be connected to the active region 4. The present disclosure only relates to changing the specific position of the active region 4 from a plane to an inclined surface without substantially changing the structure, and thus detailed description thereof is omitted herein.

In addition, the structures such as pixel electrode and organic light-emitting diode for displaying shall not be arranged on the inclined supporting surface 1 so as not to adversely influence the display effect.

Optionally, in some embodiments of the present disclosure, the array substrate further includes a plurality of strip-like protuberances 11 that are arranged on the base 9 and made of insulation materials such as silicon nitride and silicon oxide, wherein each of the protuberances 11 has at least one lateral surface that is inclined relative to the base 9, and the lateral surface is the inclined supporting surface 1.

As mentioned above, optionally, the leads are arranged on the inclined supporting surface 1. However, the array substrate originally does not include the inclined supporting surface 1. Therefore, as shown in FIGS. 1 to 4, a plurality of strip-like protuberances (protuberances 11) is arranged on the array substrate, and the lateral surface of the protuberance 11 can serve as an inclined supporting surface 1.

Optionally, each of the protuberances 11 has two lateral surfaces that are inclined relative to the base 9, and the two lateral surfaces are the inclined supporting surfaces 1.

Obviously, the protuberance 11 may have a ridge-like structure shown in FIG. 2 in order to improve its utilization ratio, so that two lateral surfaces of the protuberance 11 can be the above inclined supporting surfaces 1, and a lead can be arranged at each of the lateral surfaces.

Optionally, in some embodiments of the present disclosure, the array substrate further includes an auxiliary insulation layer 12, wherein a plurality of grooves is disposed in the auxiliary insulation layer 12, at least a lateral surface of the grooves is inclined relative to the base 9, and the lateral surface is the inclined supporting surface 1.

Figure 5:
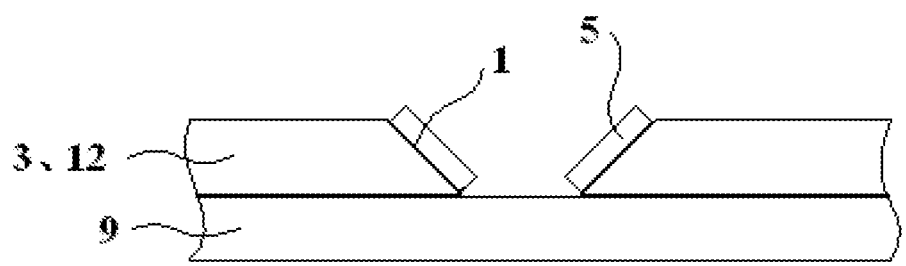
FIG. 5 is a sectional view of an array substrate where an inclined supporting surface is arranged thereon with a data line in some embodiments of the present disclosure.

Obviously, since the above protuberance 11 is manufactured independently, the process is very complex. As shown in FIG. 5, the array substrate originally includes a plurality of insulation layers such as a gate insulation layer, and a part of the leads such as the data lines originally are arranged on the insulation layers. Therefore, if the grooves are formed in the insulation layers, the lateral surfaces of the grooves also can serve as the inclined supporting surfaces 1.

Of course, when the grooves are formed, it should be ensured that no accidental electrical connection is generated between the lead and the other structures. There are various methods for disposing grooves. For example, the grooves can be broken off at a position where the grooves overlap with a conductive structure at a lower layer, or a thickness of each of the grooves 12 that extends in a direction perpendicular to the base 9 is smaller than a thickness of the auxiliary insulation layer 12, without cutting through the auxiliary insulation layer 12.

Optionally, the auxiliary insulation layer 3 is a gate insulation layer 3, and the inclined lead arranged on the lateral surface of the groove of the gate insulation layer 3 is the data line 5.

In an array substrate in the related art, the data line 5 is generally arranged on the gate insulation layer 3. Therefore, the groove just can be formed in the gate insulation layer 3 so as to form the inclined supporting surface 1 configured to support the data line 5.

As shown in FIGS. 1 to 5, in some embodiments, the present disclosure provides a method for manufacturing an array substrate, which includes steps of: forming inclined supporting surfaces 1 on a base 9, wherein the inclined supporting surfaces 1 are strip-like and are inclined relative to the base 9, and the length direction of each of the inclined supporting surfaces is parallel to the base 9; and forming inclined leads, wherein at least a part of each of the inclined leads is arranged on the corresponding inclined supporting surface 1 and extends in the length direction of the inclined supporting surface 1.

That is, during the manufacturing of the array substrate, the inclined supporting surface 1 is firstly formed, and then, the above inclined leads are formed on the inclined supporting surface 1. Of course, if the inclined leads include a plurality of leads that are arranged at different layers, there will be a plurality of inclined supporting surfaces 1.

For example, a specific method of manufacturing an array substrate may include steps of: S201: forming a plurality of protuberances 11 on the base 9 by a patterning process, wherein the patterning process includes one or more of the steps of forming a film layer, coating a photoresist, exposing, developing, etching and removing photoresist.

Since etching is carried out from top to bottom, the lateral surface of the remained structure after the etching is inclined relative to the base 9, so it can function as the inclined supporting surface 1.

S202: forming a gate line 2 by a patterning process, wherein at least a part of the gate line 2 is arranged on a lateral surface (an inclined supporting surface 1) of the protuberance 11 so that the gate line 2 is an inclined lead.

In this step, when a gate metal layer is formed, the gate metal layer arranged at the lateral surface of the protuberance 11 is inclined. Therefore, in the following etching step, as long as the gate metal layer at other positions is removed, the remaining gate metal layer may become the gate line 2 on the inclined supporting surface 1. Therefore, this step only needs to be carried out in a conventional process.

S203: forming a gate insulation layer 3 that covers the gate line 2 by a patterning process, and forming a groove in the gate insulation layer 3.

In other words, when the gate insulation layer 3 is formed and the groove is disposed therein, the lateral surface of the groove is an inclined supporting surface 1. Of course, as mentioned above, the groove should not be connected to the gate line 2 (i.e. it should be ensured that the gate insulation layer 3 completely covers the gate line 2).

S204: forming an active region 4 by a patterning process, wherein the active region 4 is arranged on the gate line 2 on the inclined supporting surface 1.

S205: forming a data line 5, a source electrode and a drain electrode by a patterning process, wherein both the source electrode and the drain electrode contact the active region 4 (they are arranged on the active region 4), the data line 5 is connected to the source electrode, and at least a part of the data line 5 is arranged on a lateral surface of the groove and extends in a length direction of the lateral surface (i.e., the inclined supporting surface 1) of the above insulation layer 3. Therefore, the data line 5 is an inclined lead.

S206: forming other structures such as a passivation layer, a pixel electrode and an organic light-emitting diode so as to complete manufacturing of the array substrate.

Of course, the method of manufacturing the array substrate cannot limit the present disclosure, and it can be changed in several ways. For example, the source electrode, the drain electrode and the data line can be manufactured prior to the manufacture of the active region (that is, the source electrode and the drain electrode are arranged below the active region). For instance, the passivation layer can be formed between the source electrode and the drain electrode and the active region, and the passivation layer can be connected to the active region through via holes in the passivation layer. A third example is as follows: the active region is formed firstly, and then the gate insulation layer and the gate line (the gate electrode) are formed, i.e. the TFT may also be of a top-gate structure.

In some embodiments, the present disclosure provides a display device, which includes any one of the array substrates.

Specifically, the display device may be a product or a component having a display function such as a liquid crystal display panel, an electronic book, an OLED panel, a mobile phone, a tablet computer, a television, a display, a laptop, a digital photo frame and a navigator.

It should be understood that, the above embodiments merely are used to explain the principle of the present disclosure, and the present disclosure is not limited thereto. A person skilled in the art may make further modifications and improvements within the spirit and the essence of the present disclosure, and these modifications and improvements shall also fall within the scope of the present disclosure.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An array substrate, comprising a base, a plurality of leads and a plurality of inclined supporting surfaces,
    wherein the inclined supporting surfaces are strip-like, and are inclined relative to the base, and a length direction of each of the inclined supporting surfaces is parallel to the base; and
    at least a part of the leads are inclined leads, and at least a part of each of the inclined leads is arranged on the corresponding inclined supporting surface and extends in the length direction of the inclined supporting surface;
    the inclined leads comprise a gate line, a data line or a common electrode line,
    active regions of at least a part of thin film transistors (TFTs) are arranged on the gate lines on the inclined supporting surfaces, and a gate insulation layer is arranged between the active regions and the gate lines,
    wherein a portion of the gate line corresponding to an orthographic projection of the active region onto the gate line on the inclined supporting surface is a gate electrode.

2. The array substrate according to claim 1, wherein an angle between the inclined supporting surface and the base ranges from 45 degrees to 70 degrees.

3. The array substrate according to claim 1, further comprising:
    a plurality of strip-like protuberances that are arranged on the base and made of insulation materials, wherein at least one lateral surface of each of the protuberances is inclined relative to the base, and the lateral surface is the inclined supporting surface.

4. The array substrate according to claim 3, wherein two lateral surfaces of each of the protuberances are inclined relative to the base, and the two lateral surfaces are the inclined supporting surfaces.

5. The array substrate according to claim 1, further comprising an auxiliary insulation layer, wherein a plurality of grooves is disposed in the auxiliary insulation layer, at least one lateral surface of each of the grooves is inclined relative to the base, and the lateral surface is the inclined supporting surface.

6. The array substrate according to claim 5, wherein the auxiliary insulation layer is the gate insulation layer, and the inclined leads arranged on the at least one lateral surface of each of the grooves in the gate insulation layer are data lines.

7. A method for manufacturing an array substrate, comprising steps of:
    forming inclined supporting surfaces on a base, wherein the inclined supporting surfaces are strip-like and are inclined relative to the base, and a length direction of each of the inclined supporting surfaces is parallel to the base,
    forming inclined leads, wherein at least a part of each of the inclined leads is arranged on the corresponding inclined supporting surface and extends in the length direction of the inclined supporting surface;
    wherein the inclined leads comprise gate lines,
    wherein the step of forming the inclined leads comprises:
        forming the gate lines by a patterning process, wherein at least a part of each of the gate lines is arranged on the corresponding inclined supporting surface and extends in the length direction of the inclined supporting surface;
    subsequent to the step of forming the inclined leads, the method further comprises steps of:

forming a gate insulation layer that covers the gate lines, and forming active regions by a patterning process, wherein the active regions are arranged on the gate lines on the inclined supporting surfaces;

wherein a portion of the gate line corresponding to an orthographic projection of the active region onto the gate line on the inclined supporting surface is a gate electrode.

8. The method of manufacturing an array substrate according to claim 7, wherein the step of forming the gate insulation layer that covers the gate lines comprises:

forming the gate insulation layer that covers the gate lines by a patterning process, wherein a plurality of grooves is disposed in the gate insulation layer, and at least one lateral surface of each of the grooves is the inclined supporting surface, subsequent to the step of forming active regions by a patterning process, the method further comprises a step of:

forming source electrodes, drain electrodes and data lines by a patterning process, wherein the source electrodes and the drain electrodes contact the active regions, and the data lines are connected to the source electrodes; and at least a part of each of the data lines is arranged on the lateral surface of the groove and extends in a length direction of a lateral surface of the groove in the insulation layer.

9. A display device, comprising an array substrate, wherein the array substrate comprises a base, a plurality of leads and a plurality of inclined supporting surfaces, wherein the inclined supporting surfaces are strip-like, and are inclined relative to the base, and a length direction of each of the inclined supporting surfaces is parallel to the base; and at least a part of the leads are inclined leads, and at least a part of each of the inclined leads is arranged on the corresponding inclined supporting surface and extends in the length direction of the inclined supporting surface;

the inclined leads comprise a gate line, a data line or a common electrode line, active regions of at least a part of thin film transistors (TFTs) are arranged on the gate lines on the inclined supporting surfaces, and a gate insulation layer is arranged between the active regions and the gate lines, wherein a portion of the gate line corresponding to an orthographic projection of the active region onto the gate line on the inclined supporting surface is a gate electrode.

10. The display device according to claim 9, further comprising:

a plurality of strip-like protuberances that are arranged on the base and made of insulation materials, wherein at least one lateral surface of each of the protuberances is inclined relative to the base;

the inclined supporting surfaces are strip-like, and a length direction of each of the inclined supporting surfaces is parallel to the base;

at least a part of the leads are the inclined leads, and at least a part of each of the inclined leads is arranged on the corresponding inclined supporting surface and extends in the length direction of the inclined supporting surface.

11. The display device according to claim 10, wherein an angle between the inclined supporting surface and the base ranges from 45 degrees to 70 degrees.

12. The display device according to claim 10, wherein two lateral surfaces of each of the protuberances are inclined relative to the base, and the two lateral surfaces are the inclined supporting surfaces.

13. The display device according to claim 9, further comprising an auxiliary insulation layer, wherein a plurality of grooves is disposed in the auxiliary insulation layer, at least one lateral surface of each of the grooves is inclined relative to the base, and the lateral surface is the inclined supporting surface;

the inclined supporting surfaces are strip-like, and a length direction of each of the inclined supporting surfaces is parallel to the base;

at least a part of the leads are inclined leads, and at least a part of each of the inclined leads is arranged on the corresponding inclined supporting surface and extends in the length direction of the inclined supporting surface.

14. The display device according to claim 13, wherein the auxiliary insulation layer is the gate insulation layer, and the inclined leads arranged on the inclined supporting surfaces are data lines.

15. The display device according to claim 13, wherein a thickness of each of the grooves that extends in a direction perpendicular to the base is smaller than a thickness of the auxiliary insulation layer.

* * * * *